US006838212B2

(12) United States Patent
Meier et al.

(10) Patent No.: US 6,838,212 B2
(45) Date of Patent: Jan. 4, 2005

(54) METHOD FOR PRODUCING SCATTER LINES IN MASK STRUCTURES FOR FABRICATING INTEGRATED ELECTRICAL CIRCUITS

(75) Inventors: Wolfgang Meier, deceased, late of Oerlinghausen (DE); by Ingrid Meier, legal representative, Oerlinghausen (DE); by Bernd Meier, legal representative, Halle In Westfalen (DE)

(73) Assignee: Infineon Technologies AG, Munich (DE)

( * ) Notice: Subject to any disclaimer, the term of this patent is extended or adjusted under 35 U.S.C. 154(b) by 234 days.

(21) Appl. No.: 10/165,911

(22) Filed: Jun. 10, 2002

(65) Prior Publication Data

US 2003/0077521 A1 Apr. 24, 2003

(30) Foreign Application Priority Data

Jun. 8, 2001 (DE) .......................................... 101 27 689

(51) Int. Cl.$^7$ ............................ G03F 9/00; G06F 17/50
(52) U.S. Cl. ................................ 430/5; 430/30; 716/19
(58) Field of Search ................................ 430/5, 30, 22; 716/19

(56) References Cited

U.S. PATENT DOCUMENTS

| 6,074,787 A | 6/2000 | Takeuchi |
| 6,099,992 A | 8/2000 | Motoyama et al. |
| 6,197,452 B1 * | 3/2001 | Matumoto .................... 430/5 |

* cited by examiner

Primary Examiner—Saleha R. Mohamedulla
(74) Attorney, Agent, or Firm—Laurence A. Greenberg; Werner H. Stemer; Gregory L. Mayback

(57) ABSTRACT

In the method according to the invention, scatter lines (2, 3, 4, 5, 6, 7, 8) with a predetermined width are produced, which run at a predetermined distance from selected edges of mask structure elements (1). These scatter lines (2, 3, 4, 5, 6, 7, 8) produced are inspected with regard to compliance with a predetermined distance from adjoining edges of mask structure elements (1) and with regard to compliance with a predetermined distance from one another. Scatter lines (2, 3, 4, 5, 6, 7, 8) which fall below the predetermined distance are shortened and/or eliminated.

7 Claims, 1 Drawing Sheet

METHOD FOR PRODUCING SCATTER LINES IN MASK STRUCTURES FOR FABRICATING INTEGRATED ELECTRICAL CIRCUITS

BACKGROUND OF THE INVENTION

Field of the Invention

The invention relates to a method for producing scatter lines in mask structures for fabricating integrated electrical circuits, in which optical effects during the exposure of semiconductor wafers are compensated.

During the fabrication of integrated electrical circuits, deviations occur which arise during the projection of masks onto the resist layer of the semiconductor blank and are caused by interference phenomena on account of the very small structural dimensions, which are in the light wavelength range. The fabricated structures can thus deviate considerably from the original designed dimensions, which can lead to a low yield in production through to the total failure of all the circuits. In this case, the effects of the interferences on a specific structure always depend on the respective environment.

For compensation of these optical effects, so-called scatter bars or assist lines or scatter lines are produced on the masks used for the exposure, which are positioned as narrow rectangles beside the edges of the mask polygons. Owing to their small width, the scatter lines do not appear on the semiconductor wafer, but contribute to imaging the mask structures in the desired width and form on the semiconductor wafer.

Depending on the available distance from adjacent mask structures, it is also possible for a plurality of parallel scatter lines to be positioned beside an edge. This further improves the imaging accuracy for isolated mask structures. Conversely, if the distance between two edges of adjacent mask structures is too small to position a dedicated scatter line beside each edge, it is possible, if appropriate, for a common scatter line to be produced centrally between the edges, which thus supports the correct imaging of both edges.

In the prior art, programs for layout verification and for layout manipulation are known which produce scatter lines by making available basic operations for measuring distances and widths in mask planes and also geometrical operations for deriving new structures from the existing data. Boolean combinations of mask planes and also the inflation and shrinking of mask polygons may for example constitute such operations.

In the known methods for producing scatter lines in mask structures for fabricating integrated electrical circuits, it is disadvantageous that the scatter lines can only be produced in a very laborious manner and not with the required accuracy. In most of the known methods, existing operations are taken to the outermost limits of what is possible, which in many cases, in particular with inclined edges of mask polygons, leads to incorrect results and entails complicated correction measures. Variation of the scatter lines depending on measured distances from the edges of the mask structures is not possible in many cases, in particular in the case of the positioning of central scatter lines. Available special software for generating scatter lines has hitherto afforded only a low degree of flexibility and limited functionality.

SUMMARY OF THE INVENTION

It is an object of the invention to provide a method for producing scatter lines in mask structures by which the scatter lines are produced in the mask structures simply, accurately and effectively.

This object is achieved by means of the subject matter of the independent claims. Advantageous refinements emerge from the respective subclaims.

The invention relates to a method for producing scatter lines in mask structures. This method can be carried out by means of a computer program on a computer system.

In this case, in a first step, with the aid of standard distance inspections, all the edges of a mask plane with respect to which scatter lines are produced parallel are determined. Depending on the distance from adjacent mask structures, the edges are assigned to different classes. Edges with sufficient distance for the positioning of one parallel scatter line are assigned to a first class, edges with a sufficiently large distance for the positioning of two parallel scatter lines are assigned to a second class, etc. Adjacent edges between which the small distance only allows the positioning of a common central scatter line are combined to form edge pairs and noted in a separate list.

Afterward, scatter lines are produced with respect to all the edges determined, said scatter lines running at a specific distance and with a specific width outside the edge corresponding to them. In accordance with the assigned distance class, a plurality of parallel scatter lines are also produced, if appropriate, with respect to an edge. Centrally arranged scatter lines of predetermined width are produced with respect to the separately noted edge pairs with a small distance.

The distance of the scatter lines thus produced from all the edges of the original mask structure elements is thereupon examined, in which case a minimum distance can be prescribed for this by a user or by the computer program. The edges considered in this case usually represent the adjacent edges of those edges with respect to which the scatter lines considered run parallel. Equally, however, the minimum distances from edges of adjacent mask structure elements may also still be transgressed. In the event of the predetermined minimum distance being undershot, the corresponding scatter line is shortened, so that it complies with said minimum distance. Very short scatter lines are eliminated.

Afterward, all the scatter lines are checked with regard to compliance with the predetermined minimum distance from one another, the minimum distance to be complied with being prescribed by the user or by the computer program. If two scatter lines do not comply with the required minimum distance from one another or overlap, the relevant scatter lines are shortened in such a way that they comply exactly with the required minimum distance. Scatter lines which, through shortening, fall below a predetermined minimum length are eliminated. Eliminated scatter lines are left out of consideration during the checking of adjacent scatter lines.

The invention's production of the scatter lines achieves the best possible compensation of the optical effects during the exposure of semiconductor wafers with the mask structures and thus ensures an advantageous implementation of the designed dimensions on the semiconductor wafer.

The operations for producing scatter lines with respect to a predetermined set of edges or edge pairs and the operations for setting the minimum distances between the mask polygons and the scatter lines and between the scatter lines themselves may advantageously be combined as desired with standard operations of the computer program used.

The invention's method for producing scatter lines in mask structures has significantly simpler and shorter control files which contain the commands for producing the scatter lines. A small number of operations are required for scatter line production according to the invention. The number of operations required is a factor of 10 fewer in comparison with the known methods. Improved readability and maintainability of the control files is thus provided.

Furthermore, the scatter lines are produced significantly more effectively and more optimally in respect of run time and memory requirement by means of the method according to the invention. The run time and the memory requirement are reduced approximately by the factor 5–10 in comparison with the known methods.

Furthermore, the combination of standard operations and of special operations for the production and for the shortening of scatter lines enables particular flexibility in the application, which cannot be achieved with standard operations alone.

In this case, in a particularly advantageous manner, it is possible to take account of priorities in the shortening of scatter lines. By way of example, longer scatter lines can be treated with priority. Equally, central scatter lines can be treated with priority, or, in the case of parallel rows of scatter lines, the scatter lines positioned nearer to the mask structure elements. Furthermore, excessively short scatter lines can be excluded by taking account of minimum lengths.

The method according to the invention ensures exact compliance with distances, all necessary information advantageously being directly available and alteration of scatter lines depending on measured distances being made possible.

In accordance with one embodiment of the invention, a plurality of scatter lines can be produced parallel in each case at different distances from an edge. This ensures optimum imageability of outer regions of the mask structures and optimum imageability of isolated mask structures.

In accordance with a further embodiment of the invention, one or more scatter lines can be arranged in each case centrally between edges of closely adjacent mask polygons. In the arrangement of central scatter lines, it is often expedient to treat these central scatter lines with priority and not to permit shortening by adjacent scatter lines.

In the interspaces between mask polygons or between lines running on the mask, it is possible to provide a different number of scatter lines, depending on the magnitude of the distance formed between the mask polygons or between the lines.

In the case of a small distance between two mask polygons or between two lines, exactly one central scatter line may be provided. In the case of a somewhat larger distance between two mask polygons or lines, one scatter line may be provided per side. In addition to these two scatter lines, a further scatter line may be formed in the case of an even larger distance between two mask polygons or lines. In each case two rows of scatter lines may be arranged in the case of an even larger distance between two mask polygons or lines.

The possibility afforded by the invention of providing a different number of scatter lines depending on the distance between lines or between mask polygons makes it possible to achieve effective and situation-related imageability of mask polygons on the corresponding semiconductor wafer.

A mask structure comprises one or more mask structure elements which are present on a mask plane. These mask structure elements may also be present as mask polygons on the mask plane.

By virtue of the method according to the invention, scatter lines can be produced parallel to the edges of the mask polygons by means of a single command. Existing, lengthy calculation routines can be simplified by the method according to the invention, which combines special operations with standard operations in order to increase the flexibility. The method according to the invention affords increased flexibility and an extended application spectrum purely as special solutions.

The invention is also realized in a computer program for producing scatter lines in mask structures of integrated electrical circuits. In this case, the computer program is designed in such a way that, after a mask structure has been input, a method according to the invention can be executed, the mask structure provided with the scatter lines being output as the result of the method.

The invention additionally relates to a data carrier having such a computer program, and to a method in which such a computer program is downloaded from an electronic data network, such as for example from the Internet, onto a computer connected to the data network.

In the case of the method according to the invention, the required minimum distances between scatter lines and mask polygons can be set individually and precisely.

The order of the steps of the method for producing scatter lines in mask structures can be varied by combining method steps. By way of example, the checking and the correction of the distances of scatter lines from adjoining edges of mask polygons and the checking of the distances of scatter lines relative to one another can be carried out together.

The method according to the invention can be carried out in such a way that the individual method steps are carried out successively for the entire mask structure.

BRIEF DESCRIPTION OF THE DRAWINGS

The invention is illustrated in more detail in FIG. 1 and FIG. 2 using an exemplary embodiment.

DESCRIPTION OF THE PREFERRED EMBODIMENTS

Figure 1:
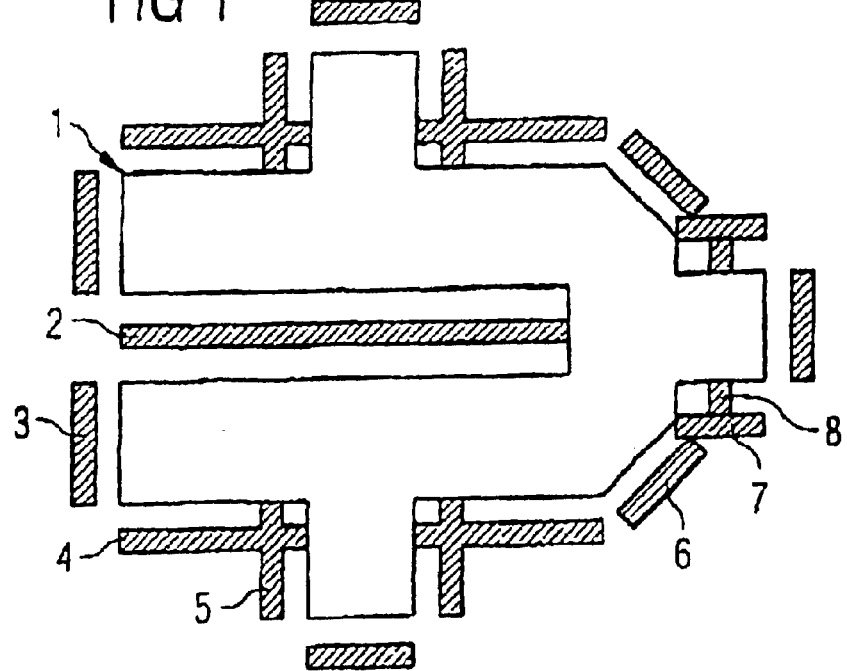
FIG. 1 shows a diagrammatic plan view of a first mask structure element 1, a first primary scatter line 2, a second primary scatter line 3, a third primary scatter line 4, a fourth primary scatter line 5, a fifth primary scatter line 6, a sixth primary scatter line 7 and a seventh primary scatter line 8 in accordance with an exemplary embodiment.
Figure 2:
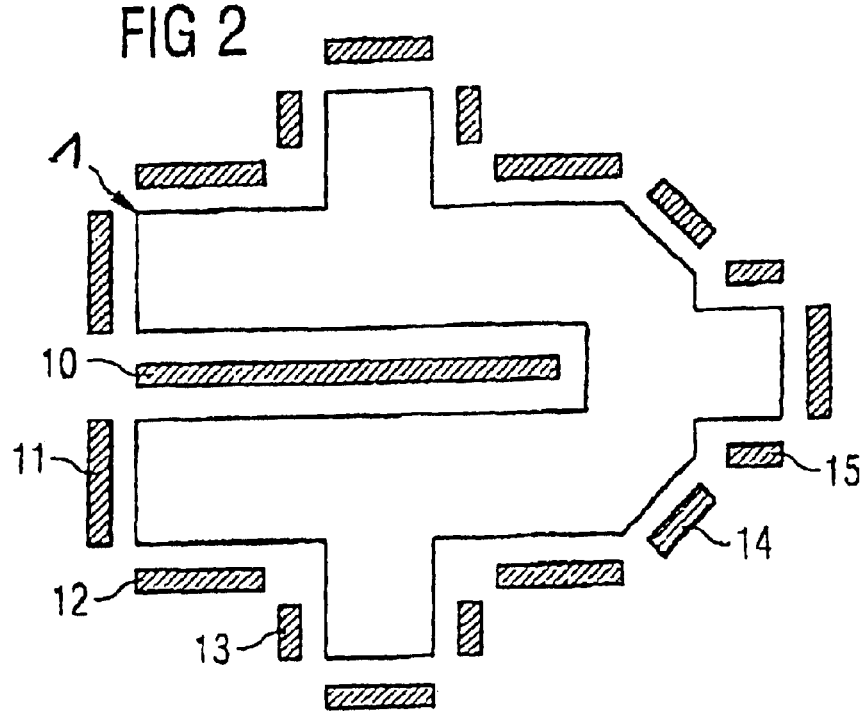
FIG. 2 shows a diagrammatic plan view of the same mask structure element 1, a first scatter line 10, a second scatter line 11, a third scatter line 12, a fourth scatter line 13, a fifth scatter line 14 and a sixth scatter line 15 in accordance with the exemplary embodiment.

FIG. 1 illustrates an intermediate result after the first steps of the method, while FIG. 2 illustrates the final result in accordance with the exemplary embodiment.

The first mask structure element 1 is contained on a mask which is used for the exposure of semiconductor wafers. The first mask structure element 1 constitutes a mask polygon, a multiplicity of mask polygons being contained on the mask plane.

The scatter lines in FIG. 2 constitute the additional rectangles which are produced by the method in accordance with the exemplary embodiment and are added to the original mask data. These scatter lines increase the imaging accuracy for the original mask structure element, but are not imaged on the semiconductor wafer themselves owing to their small width.

The exposure of semiconductor wafers by means of masks constitutes a production step in the fabrication of integrated electrical circuits, in which structures of electrical lines and of electrical components are projected onto the surface of the semiconductor wafer.

Such masks are often created by means of an electron beam writer.

The first mask structure element 1 is formed as a rectangle whose width corresponds to twice its height. This rectangle forming the basis of the first mask structure element 1 is referred to as rectangular basic form in the explanation below.

In the center of the left-hand side of the rectangle there is an indentation whose height corresponds to one quarter of the height of the rectangle and whose width corresponds to four fifths of the width of the rectangle.

Arranged in the center of the right-hand side of the rectangle is a rectangular bulge whose width corresponds to one sixth of the width of the rectangle and whose height is equal to one third of the height of the rectangle.

Both on the underside and on the top side of the rectangle there is in each case a rectangular bulge which, proceeding from the side center of the rectangle, is arranged in a manner displaced toward the left by one tenth of the side width of the rectangle. The height of the two bulges in each case corresponds to half the height of the rectangle.

The bottom right corner and the top right corner of the rectangle are in each case beveled at an angle of 45°, the bevel beginning, proceeding from the right-hand side of the rectangle, at the level of one eighth of the total side of the rectangle.

A multiplicity of narrow rectangles, referred to as "scatter bars" or "assist lines" or "scatter lines", are arranged around the first mask structure element 1 in FIG. 2. These scatter lines are applied to the mask used for the exposure of the semiconductor wafer by means of an electron beam writer. These scatter lines are formed so thin that they do not appear on the semiconductor wafer, due to optical effects. The scatter lines contribute to the electrical lines and the electrical components around which the scatter lines are arranged assuming the desired width on the semiconductor wafer.

The generation of the scatter lines illustrated in FIG. 2 is described below in accordance with the exemplary embodiment.

The generation of primary scatter lines according to the invention proceeds from existing mask structure elements.

A mask structure is present on a mask plane and comprises one or more mask structure elements, which may also be present as mask polygons.

In a first step of the method according to the invention, all edges of the mask structure elements with respect to which primary scatter lines are produced parallel are determined. These edges of the mask structure elements are determined with the aid of standard distance inspections. What are determined in this case are either edges before which there is enough free space for the laying down of scatter lines, or edge pairs between which one or more common scatter lines can be centrally arranged.

In a second step, primary scatter lines are generated which are arranged in a specific position with respect to the edges or edge pairs of the mask structure elements as selected in the first step.

In this case, firstly primary scatter lines with a predetermined width and an automatically resulting distance are arranged in the center between two edges of an edge pair of mask structure elements.

Afterward, primary scatter lines are provided at a defined distance and with a predetermined width parallel to the respective outer edges of the mask structure elements.

In the exemplary embodiment in accordance with FIG. 1, in a first step, all the edges of the first mask structure element 1 with respect to which scatter lines are produced parallel are determined.

These are all the outer edges of the first mask structure element 1 and also the upper and lower edge of the indentation of the first mask structure element 1. The last two edges mentioned are combined to form an edge pair since here a central scatter line is to be produced between the edges. All the remaining edges are detected individually.

In a second step in accordance with the exemplary embodiment in FIG. 1, the first primary scatter line 2 is generated in a manner centered between the upper and lower edges of the indentation of the first mask structure element 1. This first primary scatter line 2 accordingly runs between the left-hand side of the first mask structure element 1 and the right-hand boundary of the indentation described. It has a distance of equal magnitude both from the lower edge of the indentation and from the upper edge of the indentation. The first primary scatter line 2 terminates on the right-hand side with the end of the indentation of the first mask structure element 1.

The second primary scatter line 3 is subsequently generated. This runs parallel to that outer edge of the first mask structure element 1 which is situated on the left-hand side of the first mask structure element 1 and is arranged between the underside of the rectangular basic form of the first mask structure element 1 and the underside of the indentation. The length of the second primary scatter line 3 corresponds to the length of this outer edge.

Afterward, the third primary scatter line 4 is generated. This third primary scatter line 4 runs parallel to that outer edge of the first mask structure element 1 which constitutes the lower edge of the rectangular basic form of the first mask structure element 1. The left-hand and right-hand ends of the third primary scatter line 4 are given by the left-hand boundary of the first mask structure element 1 and by the left-hand side of the lower bulge of the first mask structure element 1. Accordingly, the third primary scatter line 4 terminates with the left-hand side of the lower bulge.

The fourth primary scatter line 5 is subsequently generated. This runs parallel to the left-hand side of the lower bulge of the first mask structure element 1 and is prescribed at the upper end by the underside of the rectangular basic form of the first mask structure element 1 and at the underside by the lower boundary of the lower bulge. Accordingly, the fourth primary scatter line 5 terminates with the lower side of the rectangular basic form of the first mask structure element 1. The third primary scatter line 4 and the fourth primary scatter line 5 run one above the other.

Afterward, the fifth primary scatter line 6 is produced. This runs parallel to the bevel of the bottom right corner of the first mask structure element 1. The ends of the fifth primary scatter line 6 are prescribed by the beginning and the end of the bevel.

Afterward, the sixth primary scatter line 7 is generated. This runs parallel to the underside of the right-hand bulge and is bounded at the left-hand side by the left-hand boundary of the rectangular basic form of the first mask structure element 1 and at the right-hand side by the right-hand end of the right-hand bulge of the first mask structure element 1. The sixth primary scatter line 7 touches the left-hand side of the rectangular basic form of the first mask structure element 1. Furthermore, the fifth primary scatter line 6 and the sixth primary scatter line 7 touch one another.

The seventh primary scatter line 8 is subsequently produced. This runs parallel to the right-hand side of the rectangular basic form of the first mask structure element 1. The seventh primary scatter line 8 terminates in a plane manner at the upper end with the lower boundary of the right-hand bulge. The lower end of the seventh primary scatter line 8 is prescribed by the beginning of the bevel of the bottom right corner of the first mask structure element 1. The lower end of the seventh primary scatter line 8 is contained in the upper side of the sixth primary scatter line 7.

All further outer edges of the first mask structure element 1 are provided with a corresponding primary scatter line. These further primary scatter lines are illustrated in the exemplary embodiment in accordance with FIG. 1 and are not described any further here.

FIG. 2 shows the same mask structure element 1 as FIG. 1, a first scatter line 10, a second scatter line 11, a third scatter line 12, a fourth scatter line 13, a fifth scatter line 14 and a sixth scatter line 15 in accordance with the exemplary embodiment.

The scatter lines in FIG. 2 represent the result of the second part of the method, as are produced from the primary scatter lines in FIG. 1 in accordance with the exemplary embodiment.

The first scatter line 10 corresponds, with regard to position, to the first primary scatter line 2, the right-hand end having a distance from the right-hand boundary of the indentation of the second mask structure element 9 which corresponds to one tenth of the height of the rectangular basic form of the mask structure element 1.

The second scatter line 11 is identical to the second primary scatter line 3 from FIG. 1 with regard to form and position.

The third scatter line 12 is arranged parallel to the underside of the rectangular basic form of the first mask structure element 1, the left-hand side of the third scatter line 12 being bounded by the left-hand side of the first mask structure element 1, and the right-hand side having a distance from the left-hand side of the lower bulge of the second mask structure element 9 which is equal to one quarter of the height of the rectangular basic form of the second mask structure element 9.

The fourth scatter line 13 is arranged parallel to the left-hand side of the lower bulge of the second mask structure element 9 and is limited at the underside by the lower boundary of the lower bulge. The upper end of the fourth scatter line 13 has a distance from the underside of the rectangular basic form of the second mask structure element 9 which corresponds to one quarter of the height of the rectangular basic form of the second mask structure element 9. Accordingly, the third scatter line 12 and the fourth scatter line 13 have a distance from one another.

The fifth scatter line 14 is arranged parallel to the bevel of the bottom right corner of the described rectangle of the second mask structure element 9. In this case, the length of the fifth scatter line 14 approximately corresponds to two thirds of the bevel of the bottom right corner of the second mask structure element 9.

The sixth scatter line 15 is arranged parallel to the underside of the right-hand bulge, the right-hand end of the sixth scatter line 15 being prescribed by the right-hand boundary of the bulge. The total length of the sixth scatter line 15 corresponds to two thirds of the underside of the right-hand bulge of the second mask structure element 9.

The edge determination and the generation of primary scatter lines were explained in the exemplary embodiment in accordance with FIG. 1.

These first two steps are then followed by a third step for the generation of scatter lines.

In this third step all pairs of a primary scatter line and an edge of the respective structure element whose distance from one another is too small are sought. A minimum distance to be complied with between the scatter line and the outer edge of the mask structure element is defined for this purpose. The primary scatter lines in which the defined minimum distance is undershot are shortened, so that the required minimum distance is complied with exactly.

In a fourth step, the scatter lines thus obtained are inspected with respect to one another. In this case, a minimum distance to be complied with between the individual scatter lines is defined. Scatter lines which fall below the required minimum distance between one another are shortened in pairs in this step until they correspond to the required minimum distance.

The third and fourth steps are carried out together in the exemplary embodiment in accordance with FIG. 2.

FIG. 2 illustrates the shortened scatter lines after steps 3 and 4 have been carried out. In the exemplary embodiment, the minimum distance which is to be complied with between a scatter line and an outer edge of the mask structure element is fixed at one tenth of the height of the rectangular basic form of the first mask structure element 1. The minimum distance to be complied with in each case between the scatter lines likewise amounts to one tenth of the height of the rectangular basic form of the first mask structure element 1. Both minimum distance values are generally fixedly prescribed by the exposure technology used.

The first primary scatter line 2 from FIG. 1 is considered first. This primary scatter line does not comply with the required minimum distance from the right-hand side of the indentation of the first mask structure element 1. Accordingly, the right-hand end of the primary scatter line 2 is shortened, so that the distance between the right-hand end thereof and the right-hand end of the indentation satisfies the minimum distance. The required minimum distance from all the other scatter lines is complied with. The first scatter line 10 produced is illustrated in FIG. 2.

The second primary scatter line 3 is subsequently considered. This primary scatter line complies with the required minimum distances from the corresponding outer edge of the first mask structure element 1 and from the first primary scatter line 2 and the third primary scatter line 4. Accordingly, the second primary scatter line 3 is not shortened. The second scatter line 11 thus produced from the second primary scatter line 3 is illustrated in FIG. 2.

Afterward, the third primary scatter line 4 and the fourth primary scatter line 5 are considered. These two primary scatter lines overlap one another and, accordingly, do not comply with the required minimum distance from one another. Furthermore, the third primary scatter line 4 has no distance from the left-hand boundary of the lower bulge of the first mask structure element 1. Furthermore, there is no minimum distance between the fourth primary scatter line 5 and the underside of the rectangular basic form of the first mask structure element 1.

Accordingly, the third primary scatter line 4 and the fourth primary scatter line 5 are shortened until they have the minimum distances both from the outer edges of the first mask structure element 1 and from one another. The third scatter line 12 thus produced and the fourth scatter line 13 thus produced are illustrated in FIG. 2.

The fifth primary scatter line 6 and the sixth primary scatter line 7 are subsequently considered. The fifth primary scatter line 6 and the sixth primary scatter line 7 touch one another and, consequently, do not comply with the required minimum distance from one another. Furthermore, the sixth primary scatter line 7 touches the first mask structure element 1 and thus falls below the required minimum distance from the outer edge of the first mask structure element 1.

The fifth primary scatter line 6 and the sixth primary scatter line 7 are accordingly shortened until they comply with the required minimum distances both from the outer edges of the first mask structure element 1 and from one another. Accordingly, the fifth scatter line 14 and the sixth scatter line 15 are generated.

Afterward, the seventh primary scatter line 8 is considered. This short primary scatter line has an excessively small distance from the right-hand bulge of the first mask structure element 1. Furthermore, this seventh primary scatter line 8 has an excessively small distance from the sixth primary scatter line 7. The primary scatter line would become too short as a result of the required shortening. Accordingly, the seventh primary scatter line 8 is eliminated.

With all the further scatter lines that are illustrated in FIG. 1 and are not explained here, the procedure is the same as that effected on the basis of the scatter lines shown. The distances of the primary scatter lines from the respective outer edges of the first mask structure element 1 are checked. Afterward, the distances of the primary scatter lines from one another are considered. Excessively small distances are corrected by the corresponding primary scatter lines being shortened or, if appropriate, eliminated. The scatter lines shown in FIG. 2 are thus produced from the primary scatter lines illustrated in FIG. 1.

The exemplary embodiment is ended at this point.

We claim:

1. A method for producing scatter lines in at least one mask structure present as a file in which the mask structure has mask structure elements on a mask plane and the mask structure is for fabricating integrated electrical circuits, the method which comprises:

step 1) determining edges or edge pairs bounding the mask structure elements on the mask plane, and producing scatter lines parallel to the edges or edge pairs, depending on a respective distance from other mask structure elements;

step 2) producing scatter lines as narrow rectangles having predetermined distances and predetermined widths such that the scatter lines run beside the edges determined in step 1 or run centrally between the edge pairs determined in step 1, the scatter lines having lengths corresponding to lengths of the edges, which are associated with the scatter lines;

step 3) inspecting the scatter lines produced in step 2 to determine whether the scatter lines produced in step 2 comply with a first predetermined distance from the original mask structure elements, and shortening or eliminating ones of the scatter lines produced in step 2 falling below the first predetermined distance; and step 4) pairwise inspecting the scatter lines produced in step 2 and in step 3 to determine whether the scatter lines produced in step 2 and in step 3 comply with a second predetermined distance from one another, and shortening or eliminating ones of the scatter lines produced in step 2 and in step 3 falling below the second predetermined distance.

2. The method according to claim 1, wherein step 2 includes producing a plurality of scatter lines in parallel with and at different distances from a respective one of the edges.

3. The method according to claim 1, wherein step 2 includes producing one or more centrally running scatter lines between parallel running edges of ones of the mask structure elements.

4. The method according to claim 1, which comprises prescribing a minimum length for the scatter lines; and when correcting adjacent ones of the scatter lines, not considering scatter lines that will be eliminated for falling below the minimum length.

5. A computerized method for producing scatter lines in at least one mask structure present as a file in which the mask structure has mask structure elements on a mask plane and the mask structure is for fabricating integrated electrical circuits, the method which comprises:

step 1) determining edges or edge pairs bounding the mask structure elements on the mask plane, and producing scatter lines parallel to the edges or edge pairs, depending on a respective distance from other mask structure elements;

step 2) producing scatter lines as narrow rectangles having predetermined distances and predetermined widths such that the scatter lines run beside the edges determined in step 1 or run centrally between the edge pairs determined in step 1, the scatter lines having lengths corresponding to lengths of the edges, which are associated with the scatter lines;

step 3) inspecting the scatter lines produced in step 2 to determine whether the scatter lines produced in step 2 comply with a first predetermined distance from the original mask structure elements, and shortening or eliminating ones of the scatter lines produced in step 2 failing below the first predetermined distance; and step 4) pairwise inspecting the scatter lines produced in step 2 and in step 3 to determine whether the scatter lines produced in step 2 and in step 3 comply with a second predetermined distance from one another, and shortening or eliminating ones of the scatters lines produced in step 2 and in step 3 falling below the second predetermined distance.

6. A computer readable medium having computer-executable instructions for:

receiving an input file including at least one mask structure; and performing a method for producing scatter lines in the mask structure in which the mask structure has mask structure elements on a mask plane and the mask structure is for fabricating integrated electrical circuits, the method which comprises:

step 1) determining edges or edge pairs bounding the mask structure elements on the mask plane, and producing scatter lines parallel to the edges or edge pairs, depending on a respective distance from other mask structure elements;

step 2) producing scatter lines as narrow rectangles having predetermined distances and predetermined widths such that the scatter lines run beside the edges determined in step 1 or run centrally between the edge pairs determined in step 1, the scatter lines having lengths corresponding to lengths of the edges, which are associated with the scatter lines;

step 3) inspecting the scatter lines produced in step 2 to determine whether the scatter lines produced in step 2 comply with a first predetermined distance from the original mask structure elements, and shortening or eliminating ones of the scatter lines produced in step 2 falling below the first predetermined distance;

step 4) pairwise inspecting the scatter lines produced in step 2 and in step 3 to determine whether the scatter lines produced in step 2 and in step 3 comply with a second predetermined distance from one another, and shortening or eliminating ones of the scatter lines produced in step 2 and in step 3 falling below the second predetermined distance; and step 5) prescribing a minimum length for the scatter lines; and when correcting adjacent ones of the scatter lines, not considering scatter lines that will be eliminated for falling below the minimum length.

7. A method for producing scatter lines in at least one mask structure present as a file in which the mask structure has mask structure elements on a mask plane and the mask structure is for fabricating integrated electrical circuits, the method which comprises downloading computer-executable instructions from an electronic data network to a computer connected to the data network, the computer-executable instructions being for:

step 1) determining edges or edge pairs bounding the mask structure elements on the mask plane, and producing scatter lines parallel to the edges or edge pairs, depending on a respective distance from other mask structure elements;

step 2) producing scatter lines as narrow rectangles having predetermined distances and predetermined widths such that the scatter lines run beside the edges determined in step 1 or run centrally between the edge pairs determined in step 1, the scatter lines having lengths corresponding to lengths of the edges, which are associated with the scatter lines;

step 3) inspecting the scatter lines produced in step 2 to determine whether the scatter lines produced in step 2 comply with a first predetermined distance from the original mask structure elements, and shortening or eliminating ones of the scatter lines produced in step 2 falling below the first predetermined distance;

step 4) pairwise inspecting the scatter lines produced in step 2 and in step 3 to determine whether the scatter lines produced in step 2 and in step 3 comply with a second predetermined distance from one another, and shortening or eliminating ones of the scatter lines produced in step 2 and in step 3 falling below the second predetermined distance; and step 5) prescribing a minimum length for the scatter lines, and when correcting adjacent ones of the scatter lines, not considering scatter lines that will be eliminated for falling below the minimum length.

* * * * *

UNITED STATES PATENT AND TRADEMARK OFFICE
CERTIFICATE OF CORRECTION

PATENT NO. : 6,838,212 B2
DATED : January 4, 2005
INVENTOR(S) : Wolfgang Meier

It is certified that error appears in the above-identified patent and that said Letters Patent is hereby corrected as shown below:

<u>Column 10,</u>
Line 39, should read as follows:
-- falling below the first predetermined distance; and --

Signed and Sealed this

Twenty-sixth Day of April, 2005

JON W. DUDAS
*Director of the United States Patent and Trademark Office*